United States Patent
Hung et al.

(10) Patent No.: US 8,031,523 B2
(45) Date of Patent: Oct. 4, 2011

(54) MEMORY AND READING METHOD THEREOF

(75) Inventors: Chun-Hsiung Hung, Hsinchu (TW); Hsin-Yi Ho, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 688 days.

(21) Appl. No.: 12/183,285

(22) Filed: Jul. 31, 2008

(65) Prior Publication Data

US 2010/0027331 A1    Feb. 4, 2010

(51) Int. Cl.
*G11C 11/34* (2006.01)
*G11C 16/04* (2006.01)
(52) U.S. Cl. ............ 365/185.03; 365/185.2; 365/185.01
(58) Field of Classification Search ............. 365/185.02, 365/185.03, 185.24, 189.09
See application file for complete search history.

(56) References Cited

U.S. PATENT DOCUMENTS

| 7,103,706 | B1 * | 9/2006 | Van Buskirk et al. | 711/103 |
| 2006/0062054 | A1 * | 3/2006 | Hamilton et al. | 365/189.07 |
| 2007/0268753 | A1 * | 11/2007 | Lue et al. | 365/185.28 |
| 2009/0231915 | A1 * | 9/2009 | Lusky et al. | 365/185.03 |
| 2010/0002505 | A1 * | 1/2010 | Ho et al. | 365/185.03 |

* cited by examiner

*Primary Examiner* — Anh Phung
*Assistant Examiner* — Khamdan Alrobaie
(74) *Attorney, Agent, or Firm* — Thomas|Kayden

(57) ABSTRACT

A method for reading a memory, which includes a memory cell having a first half cell and a second half cell, includes the following steps. A first voltage is applied to the memory cell to determine whether a threshold voltage of the first half cell is higher than a predetermined value or not. If the threshold voltage of the first half cell is higher than the predetermined value, a second voltage higher than the first voltage is applied to the memory cell to read data stored in the second half cell, otherwise a third voltage lower than the first voltage is applied to the memory cell to read the data stored in the second half cell.

17 Claims, 3 Drawing Sheets

MEMORY AND READING METHOD THEREOF

BACKGROUND OF THE INVENTION

1. Field of the Invention

The invention relates in general to a method for reading a memory and a memory, and more particularly to a memory reading method capable of enlarging the read window and reducing the read disturbance and a memory using the same.

2. Description of the Related Art

Memories are now applied to various data storage purposes and are classified into many types, one of which is a multi-level cell (MLC) memory. FIG. 1A (Prior Art) is a schematic illustration showing a conventional multi-level cell 100. Referring to FIG. 1A, the multi-level cell 100 includes a left half cell 110 and a right half cell 120. Each half cell of the multi-level cell 100 may have many bits according to different threshold voltage distributions.

Illustrations will be made by taking each half cell having two bits as an example. FIG. 1B (Prior Art) is a graph showing the threshold voltage distributions of the multi-level cell 100. The threshold voltage distributions of the left half cell 110 and the right half cell 120 are usually and sequentially defined as, without limitation to, (11, 10, 01, 00). Each threshold voltage distribution in FIG. 1B has to be possibly concentrated to keep the sufficient read window.

However, the threshold voltage of the right half cell 120 is influenced by the threshold voltage of the left half cell 110 due to a second-bit effect. So, the read window is decreased to cause an error when the right half cell 120 is being read. In addition, if a bit line voltage or a word line voltage for reading is too high, a low threshold voltage of the left half cell 110 may be influenced so that a read disturbance phenomenon may occur when the left half cell 110 is being read.

SUMMARY OF THE INVENTION

The invention is directed to a method for reading a memory and a memory, wherein data stored in a target half cell is read according to different voltages by determining high/low threshold voltages of a neighboring half cell so that the advantages of enlarging the read window and reducing the read disturbance can be obtained.

According to a first aspect of the present invention, a method for reading a memory is provided. The memory includes at least one memory cell including a first half cell and a second half cell. The method includes the following steps. A first voltage is applied to the memory cell to determine whether a threshold voltage of the first half cell is higher than a predetermined value or not. If the threshold voltage of the first half cell is higher than the predetermined value, a second voltage higher than the first voltage is applied to the memory cell to read data stored in the second half cell, otherwise a third voltage lower than the first voltage is applied to the memory cell to read the data stored in the second half cell.

According to a second aspect of the present invention, a memory is provided. The memory includes at least one memory cell and a circuit. The memory cell includes a first half cell and a second half cell. The circuit is for applying voltages to the memory cell. The circuit applies a first voltage to the memory cell to determine whether a threshold voltage of the first half cell is higher than a predetermined value or not, and applies a second voltage, which is higher than the first voltage, to the memory cell to read data stored in the second half cell if the threshold voltage of the first half cell is higher than the predetermined value, otherwise the circuit applies a third voltage, which is lower than the first voltage, to the memory cell to read the data stored in the second half cell.

The invention will become apparent from the following detailed description of the preferred but non-limiting embodiment. The following description is made with reference to the accompanying drawings.

DETAILED DESCRIPTION OF THE INVENTION

The invention provides a method for reading a memory and a memory, wherein data stored in a target half cell is read according to different voltages by judging high/low threshold voltages of a neighboring half cell. Thus, it is possible to enlarge the read window and reduce the read disturbance.

Illustrations will be made by taking a multi-level cell (MLC) memory as the memory and multi-level cells as the memory cells as an example in the embodiments of the invention hereinafter, and it is not limited thereto.

Figure 1A:
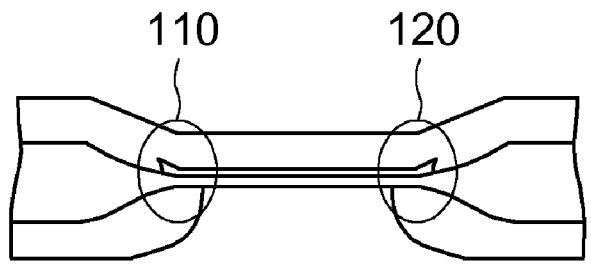
FIG. 1A (Prior Art) is a schematic illustration showing a conventional multi-level cell.
Figure 1B:
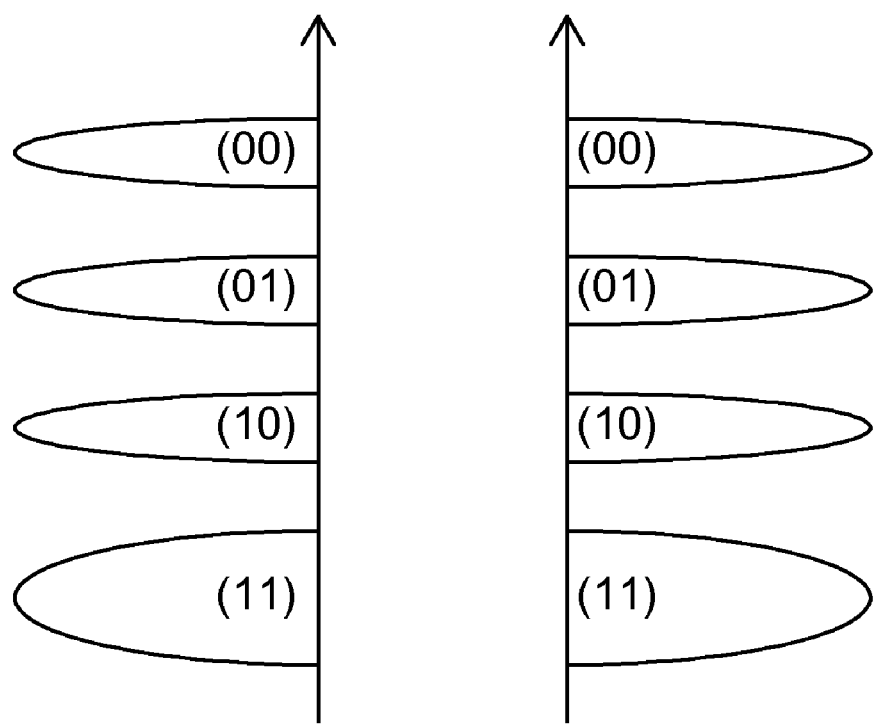
FIG. 1B (Prior Art) is a graph showing threshold voltage distributions of the multi-level cell.
Figure 2:
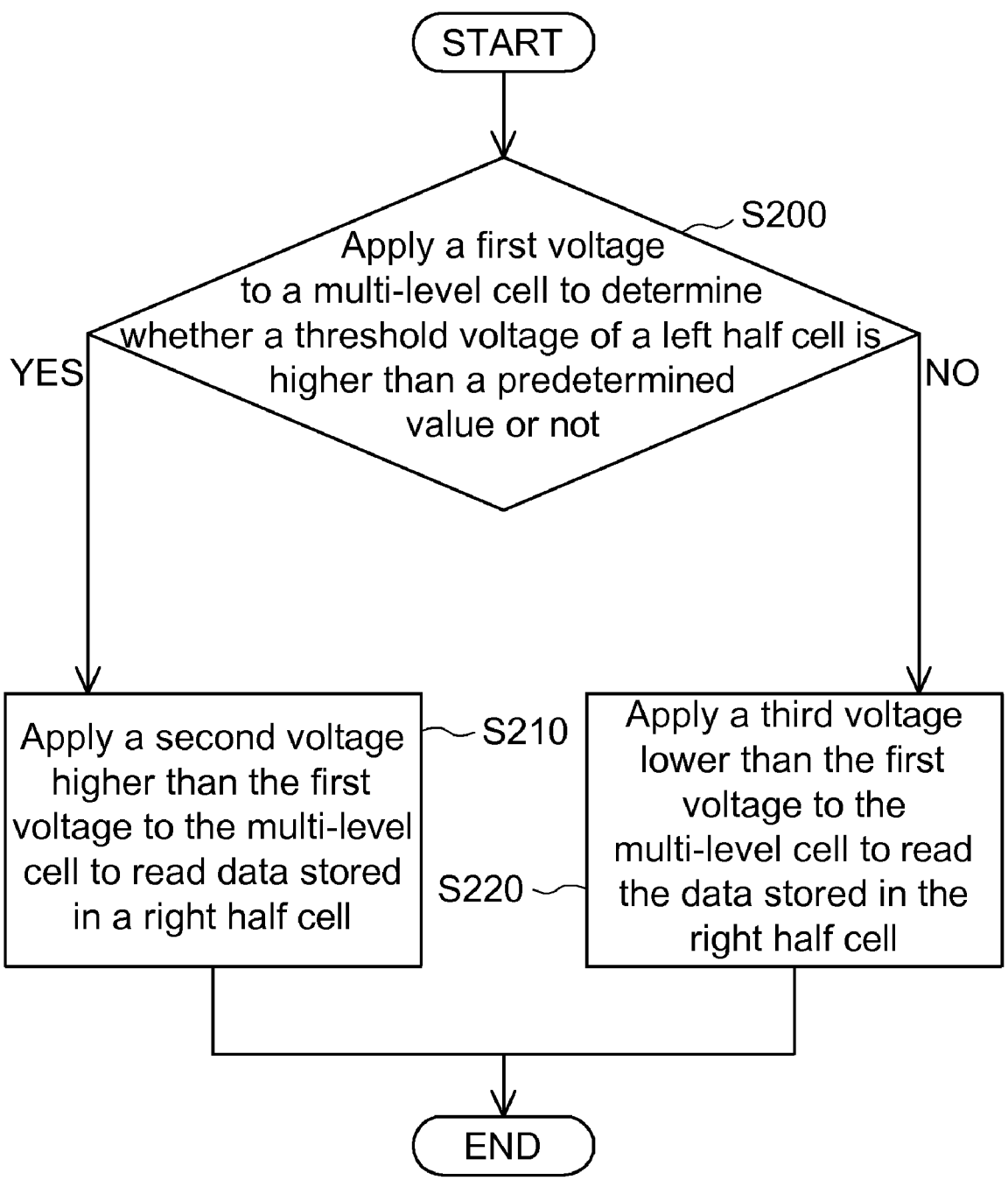
FIG. 2 is a flow chart showing a method for reading a memory according to a preferred embodiment of the invention.

FIG. 2 is a flow chart showing a method for reading a memory according to a preferred embodiment of the invention. The method for reading the memory according to this embodiment is substantially applied to a multi-level cell (MLC) memory, which includes multiple memory cell blocks each including multiple multi-level cells. Each multi-level cell includes a left half cell and a right half cell. The multi-level cell memory is a charge trapped memory, for example.

Illustrations will be made by taking a right half cell of a multi-level cell as a target cell as an example, wherein a left half cell of the multi-level cell is a neighboring cell of the target cell. First, in step S200, a first voltage is applied to a bit line at a drain of the multi-level cell to determine whether a threshold voltage of the neighboring left half cell is higher than a predetermined value or not. The predetermined value is substantially 4 Volts. The first voltage is an up-limited drain side voltage of the multi-level cell that does not result in the read disturbance, such as 1.6 Volts, and it is not limited thereto and may be changed with the development of the manufacturing process. The step S200 is substantially to determine whether the threshold voltage of the neighboring left half cell pertains to the high threshold voltage or the low threshold voltage.

If the threshold voltage of the left half cell is higher than the predetermined value, that is, if the threshold voltage of the left half cell pertains to the high threshold voltage, a second voltage higher than the first voltage is applied to the bit line at the drain of the multi-level cell to read data stored in the target right half cell in step S210. The second voltage is a high-bit line voltage, such as 1.8 Volts. To the multi-level cell, the threshold voltages of the left half cell and the right half cell will comparatively not affected if the drain is biased at a high voltage level. Therefore, in step 210, reading the data stored in the right half cell according to the high-bit line voltage can decrease the influence of the second-bit effect on the threshold voltage of the right half cell so that the read window is enlarged. In addition, because the threshold voltage of the left half cell pertains to the high threshold voltage, it will not affected by the bit line voltage so that the read disturbance is reduced.

If the threshold voltage of the left half cell is lower than the predetermined value, that is, if the threshold voltage of the left half cell pertains to the low threshold voltage, a third voltage lower than the first voltage is applied to the bit line at the drain of the multi-level cell to read the data stored in the right half cell in step S220. The third voltage is a low-bit line voltage, such as 1.4 Volts. Because the threshold voltage of the left half cell pertains to the low threshold voltage, the high-bit line voltage tends to influence the low threshold voltage of the left half cell and to approach the high threshold voltage if the data stored in the right half cell is read according to the high-bit line voltage. Thus, the read disturbance phenomenon tends to occur when the left half cell is being read. So, reading the data stored in the right half cell according to the low-bit line voltage can prevent the low threshold voltage of the left half cell from being influenced, and can decrease the read disturbance phenomenon.

In addition, the first voltage, the second voltage and the third voltage are applied to the drain of the multi-level cell in the method of reading the memory. However, the invention is not limited thereto. The first voltage, the second voltage and the third voltage may also be applied to a word line corresponding to the multi-level cell to achieve the same effect.

Figure 3:
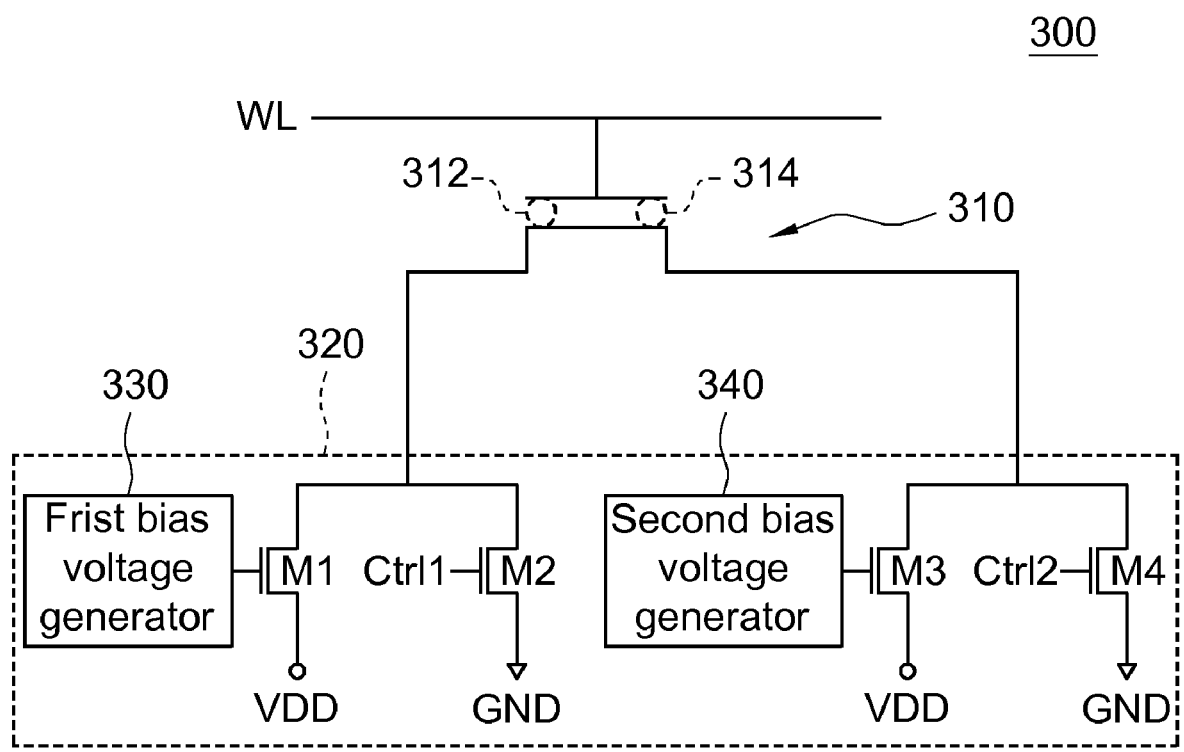
FIG. 3 is a partial circuit diagram of a memory according to a preferred embodiment of the invention.

In addition, the invention also provides a memory. Referring to FIG. 3, a partial circuit diagram of a memory according to a preferred embodiment of the invention is shown. The memory 300, such as a charge trapped memory, includes multiple multi-level cells and a circuit 320. In FIG. 3, only a multi-level cell 310 is taken as exemplified and it is not limited thereto. The multi-level cell 310 includes a first half cell 312 and a second half cell 314. The circuit 320 is for applying voltages to the multi-level cell 310. The circuit 320 applies a first voltage to the multi-level cell 310 to determine whether a threshold voltage of the first half cell 312 is higher than a predetermined value or not. The predetermined value is substantially 4 Volts.

If the threshold voltage of the first half cell 312 is higher than the predetermined value, the circuit 320 applies a second voltage, which is higher than the first voltage, to the multi-level cell 310 to read data stored in the second half cell 314. Otherwise, the circuit 320 applies a third voltage, which is lower than the first voltage, to the multi-level cell 310 to read the data stored in the second half cell 314. Wherein the first voltage, the second voltage and the third voltage are applied to the drain of the multi-level cell in the method of reading the memory, for example. The first voltage is substantially 1.6 Volts. However, the invention is not limited thereto. The first voltage, the second voltage and the third voltage may also be applied to a word line WL corresponding to the multi-level cell 310.

In addition, the circuit 320 includes a first bias voltage generator 330 and a second bias voltage generator 340, a first transistor M1, a second transistor M2, a third transistor M3 and a forth transistor M4. The first transistor M1 has a first terminal coupled to a power source VDD, a second terminal coupled to the first terminal of the multi-level cell 310, and a control terminal coupled to the first bias voltage generator 330. The second transistor M2 has a first terminal coupled to the first terminal of the multi-level cell 310, a second terminal coupled to a ground voltage GND, and a control terminal for receiving a first control signal Ctrl1.

The third transistor M3 has a first terminal coupled to the power source VDD, a second terminal coupled to the second terminal of the multi-level cell 310, and a control terminal coupled to the second bias voltage generator 340. The forth transistor M4 has a first terminal coupled to the second terminal of the multi-level cell 310, a second terminal coupled to the ground voltage GND, and a control terminal for receiving a second control signal Ctrl2.

The first bias voltage generator 330 turns on the first transistor M1 by the sum of the first voltage and the threshold voltage of the first transistor M1 the first control signal Ctrl1 turns off the second transistor M2, the second bias voltage generator 340 turns off the third transistor M3, and the second control signal Ctrl2 turns on the forth transistor M4. Consequently, the voltage of the first terminal of the multi-level cell 310 is clamped at the first voltage by the first transistor M1, and the second terminal of the multi-level cell 310 is coupled to the ground voltage GND, hence the circuit 320 being able to determine whether the threshold voltage of the first half cell 312 is higher than the predetermined value or not.

If the threshold voltage of the first half cell 312 is higher than the predetermined value, the first bias voltage generator 330 turns off the first transistor M1, the first control signal Ctrl1 turns on the second transistor M2, the second bias voltage generator 340 turns on the third transistor M3 by the sum of the second voltage, which is higher than the first voltage, and the threshold voltage of the third transistor M3, and the second control signal Ctrl2 turns off the forth transistor M4. Consequently, the voltage of the second terminal of the multi-level cell 310 is clamped at the second voltage by the third transistor M3, and the first terminal of the multi-level cell 310 is coupled to the ground voltage GND, hence the circuit 320 being able to read the data stored in the second half cell 314.

If the threshold voltage of the first half cell 312 is lower than the predetermined value, the first bias voltage generator 330 turns off the first transistor M1, the first control signal Ctrl1 turns on the second transistor M2, the second bias voltage generator 340 turns on the third transistor M3 by the sum of the third voltage, which is lower than the first voltage, and the threshold voltage of the third transistor M3, and the second control signal Ctrl2 turns off the forth transistor M4. Consequently, the voltage of the second terminal of the multi-level cell 310 is clamped at the third voltage by the third transistor M3, and the first terminal of the multi-level cell 310 is coupled to the ground voltage GND, hence the circuit 320 being able to be applied to read the data stored in the second half cell 314.

The operational principles of the memory 300 mentioned above have been described in detail in the method of reading the memory disclosed in the embodiment of the invention, and is omitted hereinafter.

In the method of reading the memory and the memory according to the embodiment of the invention, it is judged whether the threshold voltage of the neighboring half cell of the to-be-read target cell pertains to the high threshold voltage or the low threshold voltage. If the threshold voltage of the neighboring half cell pertains to the high threshold voltage, the data stored in the target half cell is read according to the high bit line voltage or the high word line voltage so that the read window is enlarged and the second-bit effect is decreased. If the threshold voltage of the neighboring half cell pertains to the low threshold voltage, the data stored in the target half cell is read according to the low bit line voltage or the low word line voltage so that the read disturbance can be reduced.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for reading a memory, which comprises at least one memory cell comprising a first half cell and a second half cell, the method comprising the steps of:
   applying a first voltage to the memory cell to determine whether a threshold voltage of the first half cell is higher than a predetermined value or not; and
   applying a second voltage, which is higher than the first voltage, to the memory cell to read data stored in the second half cell if the threshold voltage of the first half cell is higher than the predetermined value, otherwise applying a third voltage, which is lower than the first voltage, to the memory cell to read the data stored in the second half cell.

2. The method according to claim 1, wherein the memory is a charge trapped memory.

3. The method according to claim 1, wherein the first voltage, the second voltage and the third voltage are applied to a drain of the memory cell.

4. The method according to claim 1, wherein the first voltage is substantially 1.6 Volts.

5. The method according to claim 1, wherein the predetermined value is substantially 4 Volts.

6. The method according to claim 1, wherein the first voltage is an up-limited drain side voltage of the memory cell that does not result in a read disturbance.

7. The method according to claim 1, wherein the first voltage, the second voltage and the third voltage are applied to a word line corresponding to the memory cell.

8. A memory, comprising:
   at least one memory cell comprising a first half cell and a second half cell; and
   a circuit for applying voltages to the memory cell;
   wherein the circuit applies a first voltage to the memory cell to determine whether a threshold voltage of the first half cell is higher than a predetermined value or not, and applies a second voltage, which is higher than the first voltage, to the memory cell to read data stored in the second half cell if the threshold voltage of the first half cell is higher than the predetermined value, otherwise the circuit applies a third voltage, which is lower than the first voltage, to the memory cell to read the data stored in the second half cell.

9. The memory according to 8, being a charge trapped memory.

10. The memory according to claim 8, where in the first voltage, the second voltage and the third voltage are applied to a drain of the memory cell.

11. The memory according to claim 8, wherein the first voltage is substantially 1.6 Volts.

12. The memory according to claim 8, wherein the predetermined value is substantially 4 Volts.

13. The memory according to claim 8, wherein the circuit comprises:
   a first bias voltage generator and a second bias voltage generator;
   a first transistor having a first terminal coupled to a power source, a second terminal coupled to a first terminal of the memory cell, and a control terminal coupled to the first bias voltage generator;
   a second transistor having a first terminal coupled to the first terminal of the memory cell, a second terminal coupled to a ground voltage, and a control terminal for receiving a first control signal;
   a third transistor having a first terminal coupled to the power source, a second terminal coupled to a second terminal of the memory cell, and a control terminal coupled to the second bias voltage generator; and
   a forth transistor having a first terminal coupled to the second terminal of the memory cell, a second terminal coupled to the ground voltage, and a control terminal for receiving a second control signal.

14. The memory according to claim 13, wherein the first bias voltage generator turns on the first transistor, the first control signal turns off the second transistor, the second bias voltage generator turns off the third transistor, and the second control signal turns on the forth transistor, such that the circuit applies the first voltage to the first terminal of the memory cell to determine whether the threshold voltage of the first half cell is higher than the predetermined value or not.

15. The memory according to claim 14, wherein if the threshold voltage of the first half cell is higher than the predetermined value, the first bias voltage generator turns off the first transistor, the first control signal turns on the second transistor, the second bias voltage generator turns on the third transistor, and the second control signal turns off the forth transistor, such that the circuit applies the second voltage, which is higher than the first voltage, to the memory cell to read data stored in the second half cell.

16. The memory according to claim 14, wherein if the threshold voltage of the first half cell is lower than the predetermined value, the first bias voltage generator turns off the first transistor, the first control signal turns on the second transistor, the second bias voltage generator turns on the third transistor, and the second control signal turns off the forth transistor, such that the circuit applies the third voltage, which is lower than the first voltage, to the memory cell to read data stored in the second half cell.

17. The memory according to claim 8, wherein the first voltage, the second voltage and the third voltage are applied to a word line corresponding to the memory cell.

* * * * *